(12) United States Patent  
Embleton et al.

(10) Patent No.: US 11,513,934 B2
(45) Date of Patent: Nov. 29, 2022

(54) SYSTEM AND METHOD FOR SERVICE LIFE MANAGEMENT BY ACTIVELY REDUCING CORROSIVE INTERACTIONS

(71) Applicant: Dell Products L.P., Hopkinton, MA (US)

(72) Inventors: Steven Embleton, Austin, TX (US); Jon Taylor Fitch, Austin, TX (US)

(73) Assignee: Dell Products L.P., Round Rock, TX (US)

( * ) Notice: Subject to any disclaimer, the term of this patent is extended or adjusted under 35 U.S.C. 154(b) by 88 days.

(21) Appl. No.: 16/938,273

(22) Filed: Jul. 24, 2020

(65) Prior Publication Data

US 2022/0030740 A1    Jan. 27, 2022

(51) Int. Cl.
G06F 11/30  (2006.01)

(52) U.S. Cl.
CPC .................. *G06F 11/3058* (2013.01)

(58) Field of Classification Search
None
See application file for complete search history.

(56) References Cited

U.S. PATENT DOCUMENTS

| | | |
|---|---|---|
| 4,337,892 A | 7/1982 | Diermayer et al. |
| 4,441,653 A | 4/1984 | Grudich |
| 5,253,674 A | 10/1993 | Argyle et al. |
| 6,229,701 B1 | 5/2001 | Kung et al. |
| 6,997,043 B2 | 2/2006 | Swanson et al. |
| 7,031,154 B2 | 4/2006 | Bash et al. |
| 7,597,616 B2 | 10/2009 | Browne et al. |
| 8,408,981 B2 | 4/2013 | Su et al. |
| 8,723,534 B2 | 5/2014 | Chey et al. |
| 9,261,926 B2 * | 2/2016 | Larsen ............... H05K 7/20209 |
| 9,807,911 B1 | 10/2017 | Bryan et al. |
| 10,631,432 B2 | 4/2020 | Gopalakrishna et al. |
| 10,757,831 B2 * | 8/2020 | Adrian ............... H05K 7/20718 |
| 10,823,439 B2 | 11/2020 | Shelnutt et al. |
| 2005/0121945 A1 | 6/2005 | Browne et al. |
| 2006/0039112 A1 | 2/2006 | Minamitani et al. |
| 2008/0204996 A1 | 8/2008 | Sun |
| 2011/0081851 A1 | 4/2011 | Franz et al. |
| 2011/0235272 A1 | 9/2011 | Bash et al. |

(Continued)

FOREIGN PATENT DOCUMENTS

CN    205690636 U    11/2016

OTHER PUBLICATIONS

"Boundary Layer"; Glenn Research Center, NASA; May 5, 2015 (https://www.grc.nasa.gov/WWW/K-12/airplane/boundlay.html).

(Continued)

*Primary Examiner* — Isaac Tuku Tecklu
(74) *Attorney, Agent, or Firm* — Chamberlain, Hrdlicka, White, Williams & Aughtry

(57) ABSTRACT

An information handling system includes a computing device, a computing component of the computing device that is housed in a chassis, and a chilled air filter that reduces a humidity level of a portion of an airflow when the chilled air filter is in an active state. The portion of the airflow thermally manages the computing component. The airflow is received by the chassis via an air receiving exchange and exhausted by the chassis via an air expelling exchange.

15 Claims, 8 Drawing Sheets

(56) References Cited

U.S. PATENT DOCUMENTS

| | | | |
|---|---|---|---|
| 2013/0070409 A1* | 3/2013 | Hoss | G06F 1/20 |
| | | | 165/104.21 |
| 2013/0242504 A1 | 9/2013 | Anthony et al. | |
| 2014/0073234 A1* | 3/2014 | Elison | H05K 7/20727 |
| | | | 361/695 |
| 2014/0355203 A1 | 12/2014 | Kondo | |
| 2015/0156917 A1 | 6/2015 | Ogawa et al. | |
| 2015/0271957 A1 | 9/2015 | Pal | |
| 2016/0034008 A1* | 2/2016 | Smith | H05K 7/20563 |
| | | | 29/428 |
| 2016/0286691 A1 | 9/2016 | Sprague et al. | |
| 2017/0089607 A1 | 3/2017 | Vichare et al. | |
| 2017/0100617 A1 | 4/2017 | Kochelek et al. | |
| 2018/0038785 A1 | 2/2018 | Goergen et al. | |
| 2018/0070473 A1* | 3/2018 | Zhang | G06F 1/181 |
| 2018/0149579 A1 | 5/2018 | Brookhart et al. | |
| 2018/0163985 A1 | 6/2018 | Shelnutt et al. | |
| 2019/0310696 A1 | 10/2019 | Campbell et al. | |
| 2019/0343022 A1 | 11/2019 | Tseng et al. | |
| 2019/0371367 A1 | 12/2019 | Asmussen et al. | |
| 2021/0100137 A1 | 4/2021 | Harrington | |
| 2022/0026968 A1 | 1/2022 | Embleton et al. | |
| 2022/0027228 A1 | 1/2022 | Embleton et al. | |
| 2022/0030741 A1 | 1/2022 | Embleton et al. | |

OTHER PUBLICATIONS

Theodore L. Bergman, Adrienne S. Lavine, Frank P. Incropera, David P. DeWitt; "Fundamentals of Heat and Mass Transfer, 7th Edition"; John Wiley & Sons, Inc.; pp. 477-482; 2011.

* cited by examiner

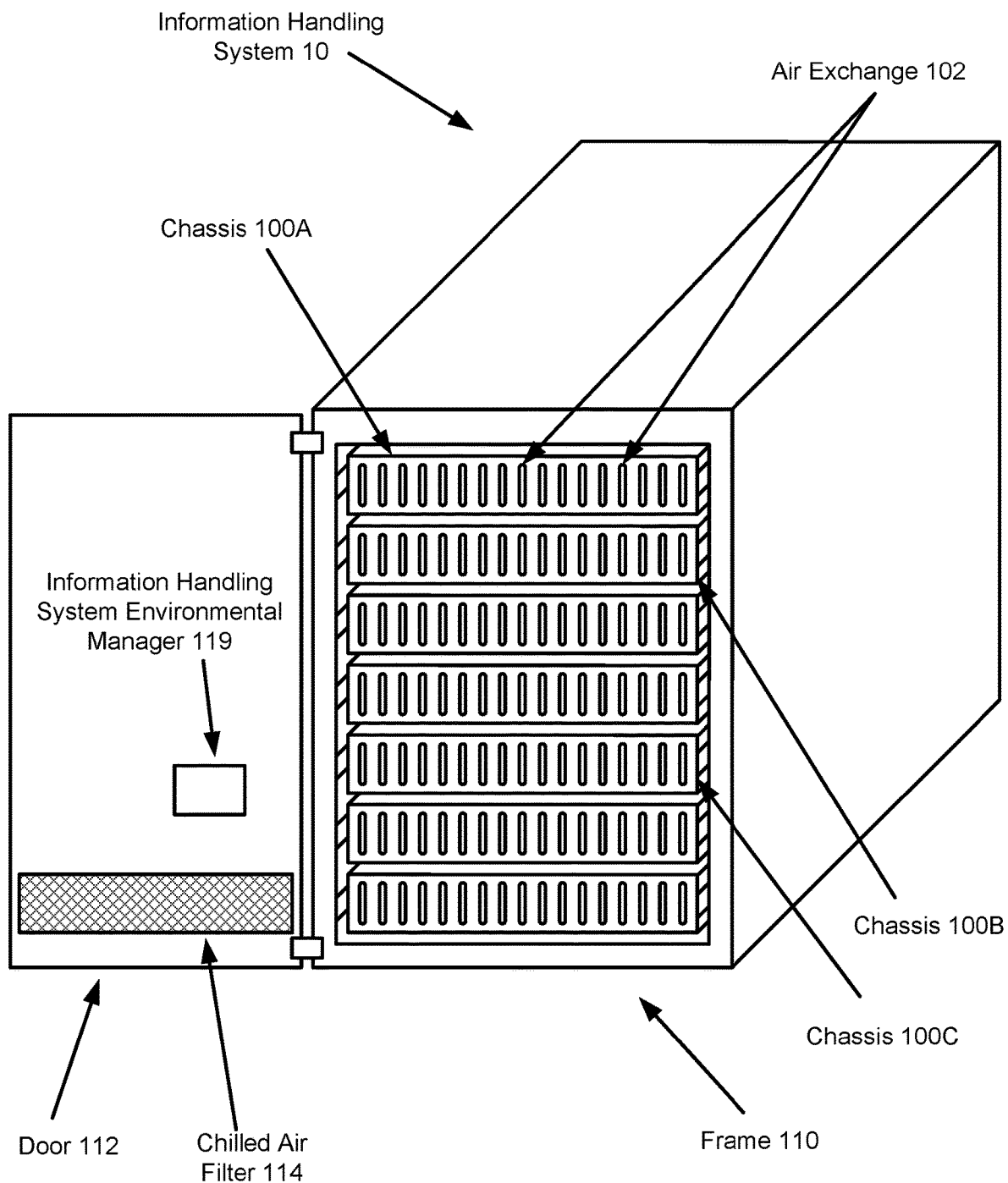
FIG. 1.1

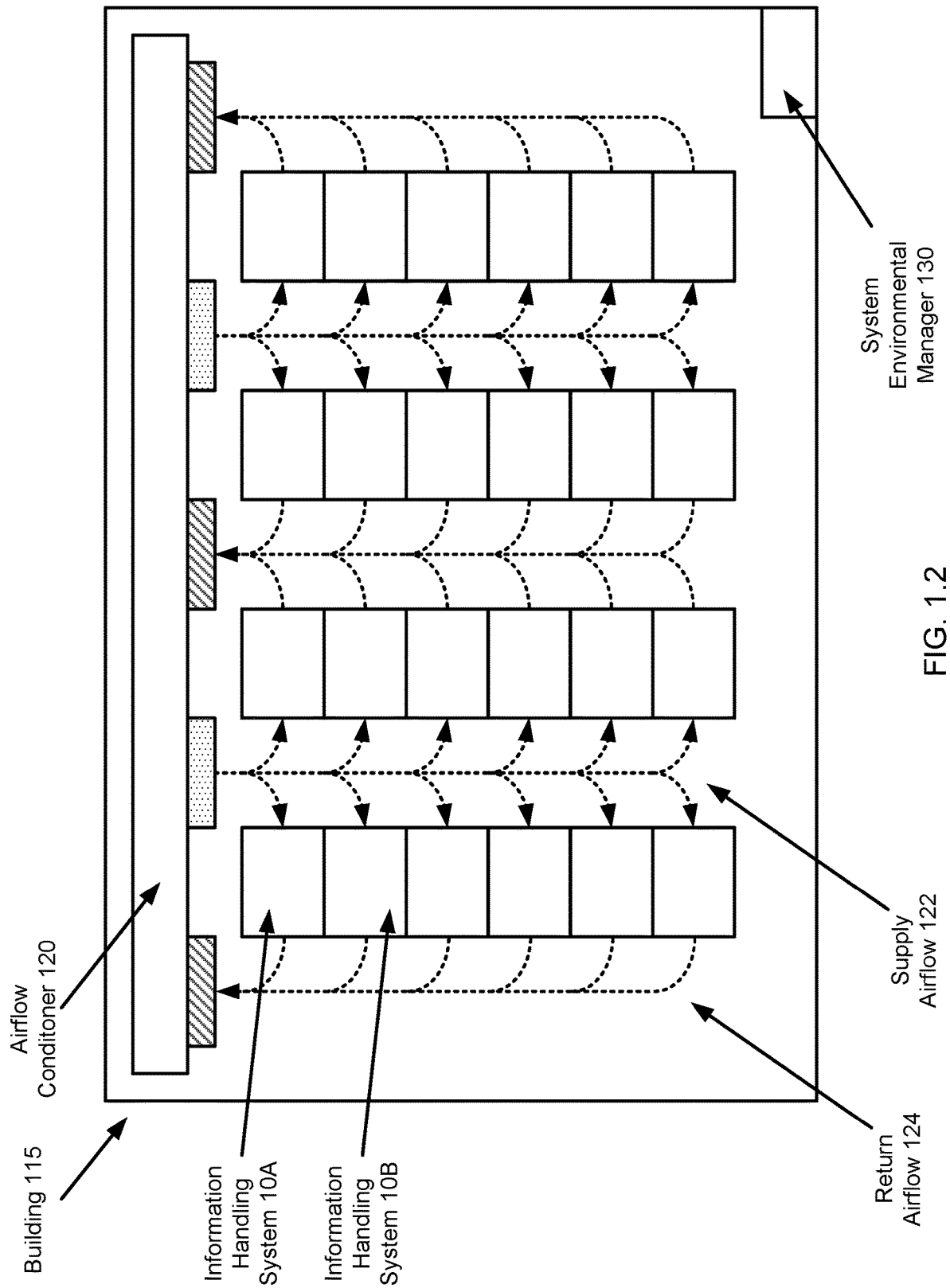
FIG. 1.2

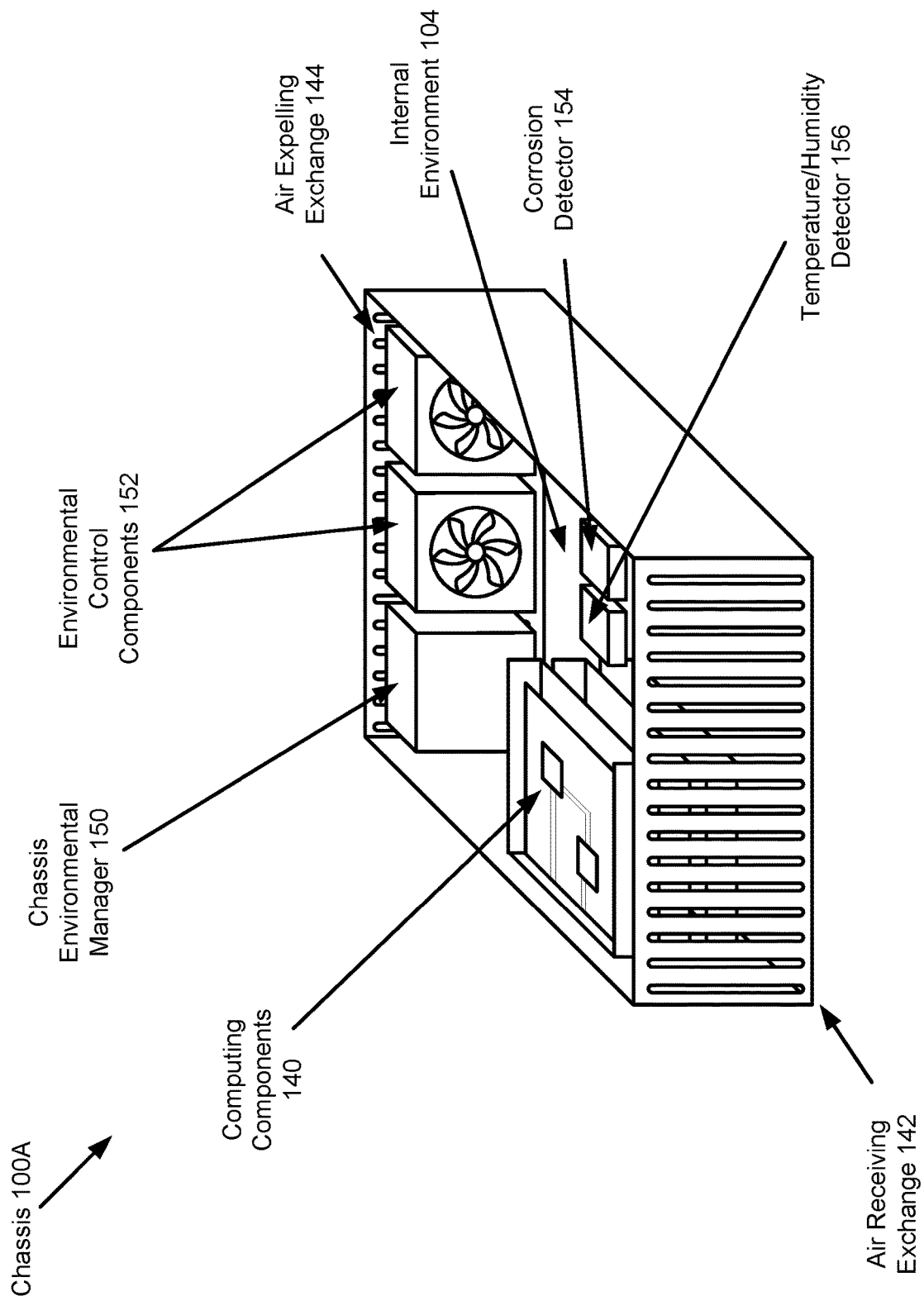
FIG. 1.3

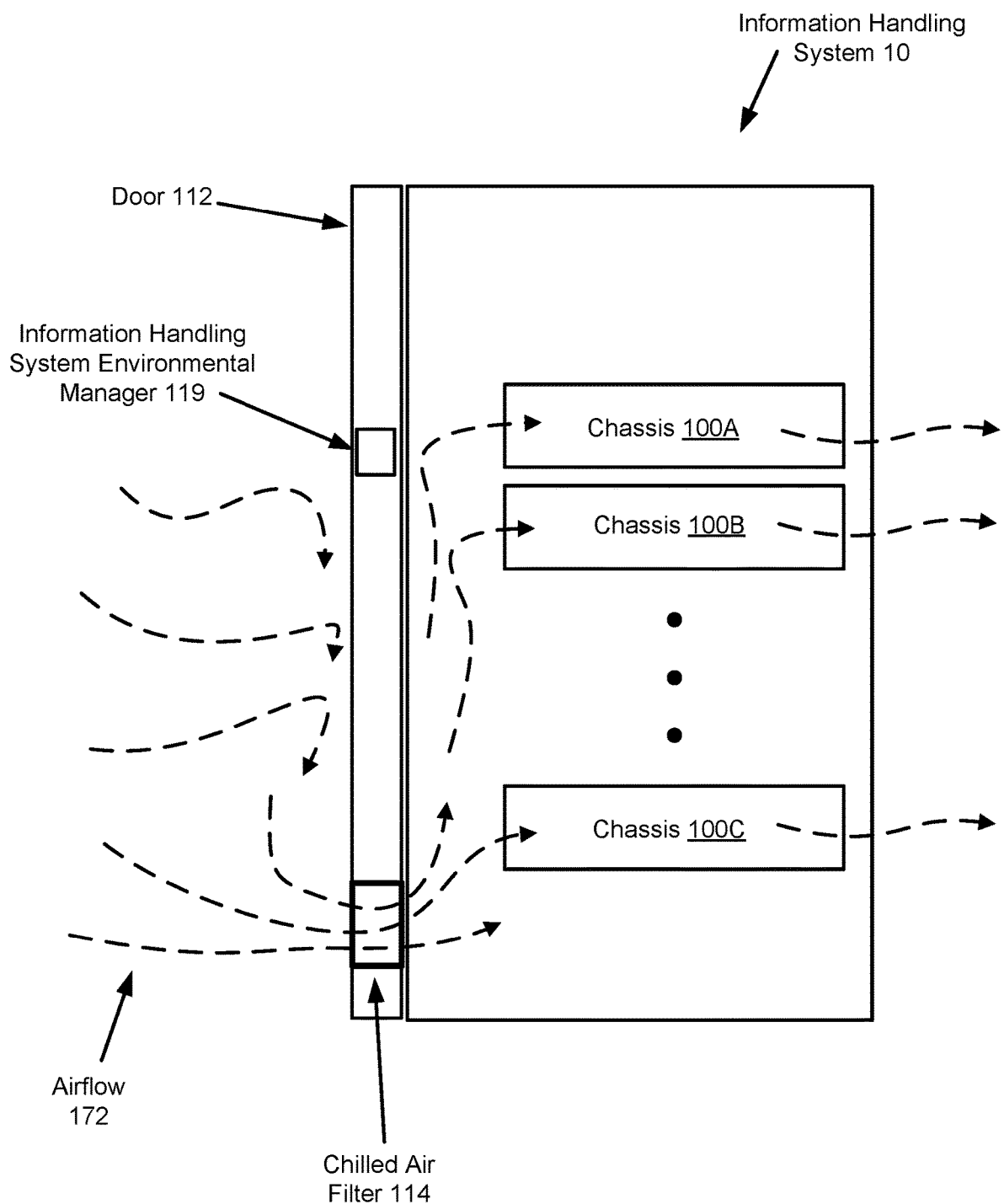
FIG. 1.4

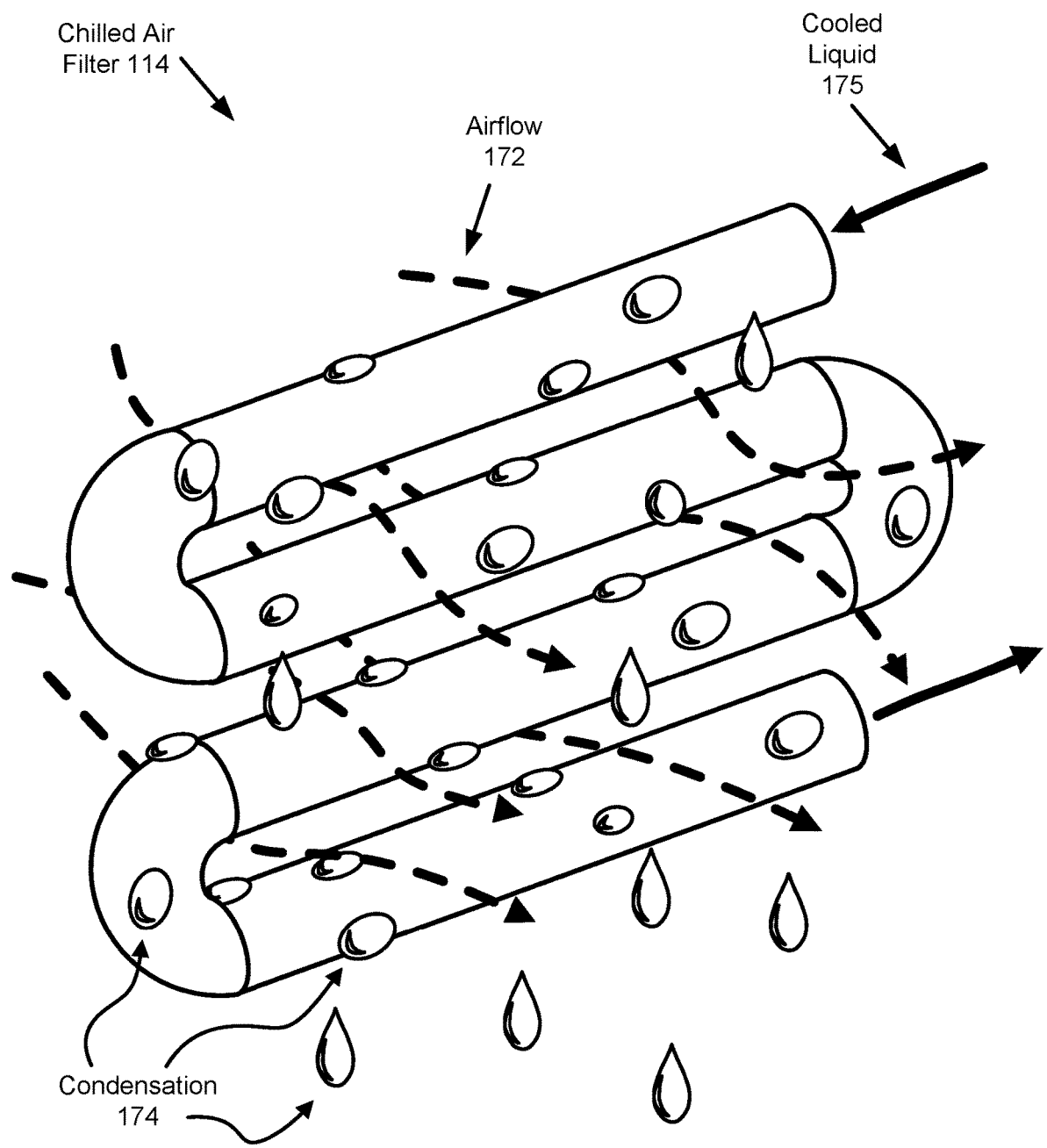
FIG. 1.5

SYSTEM AND METHOD FOR SERVICE LIFE MANAGEMENT BY ACTIVELY REDUCING CORROSIVE INTERACTIONS

BACKGROUND

As the value and use of information continues to increase, individuals and businesses seek additional ways to process and store information. One option available to users is information handling systems. An information handling system (IHS) generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

Use cases for information handling systems are causing progressively larger number of information handling systems to be disposed near each other. For example, rack mount systems utilize a rack structure to stack many information handling systems in a vertical arrangement. Due to the changing uses of information handling systems, chassis of information handling systems may modular. That is, a chassis may be composed of multiple enclosures that may be attached to each other to form the chassis of the information handling systems. When the multiple enclosures are attached, components of the information handling system disposed in each of the enclosures may become operably connected to each other.

SUMMARY

In one aspect, an information handling system in accordance with one or more embodiments of the invention includes a computing device, a computing component of the computing device that is housed in a chassis, and a chilled air filter that reduces a humidity level of a portion of an airflow when the chilled air filter is in an active state. The portion of the airflow thermally manages the computing component. The airflow is received by the chassis via an air receiving exchange and exhausted by the chassis via an air expelling exchange.

In one aspect, a method for environmentally managing an information handling system including a computing device in accordance with one or more embodiments of the invention includes thermally managing, using a portion of an airflow, a computing component of the computing device that is housed in a chassis; and reducing a humidity level of the portion of the airflow using a chilled air filter while the chilled air filter is in an active state, and the computing component is being thermally managed by the portion of the airflow. The portion of the airflow is received by the chassis via an air receiving exchange and exhausted by the chassis via an air expelling exchange.

In one aspect, a non-transitory computer readable medium in accordance with one or more embodiments of the invention includes computer readable program code, which when executed by a computer processor enables the computer processor to perform a method for environmentally managing an information handling system comprising a computing device. The method includes thermally managing, using a portion of an airflow, a computing component of the computing device that is housed in a chassis; and reducing a humidity level of the portion of the airflow using a chilled air filter while the chilled air filter is in an active state, and the computing component is being thermally managed by the portion of the airflow. The portion of the airflow is received by the chassis via an air receiving exchange and exhausted by the chassis via an air expelling exchange.

Other aspects of the invention will be apparent from the following description and the appended claims.

BRIEF DESCRIPTION OF DRAWINGS

Certain embodiments of the invention will be described with reference to the accompanying drawings. However, the accompanying drawings illustrate only certain aspects or implementations of the invention by way of example and are not meant to limit the scope of the claims.

FIG. 1.1 shows a diagram of an information handling system in accordance with one or more embodiments of the invention.

FIG. 1.2 shows a diagram of a building that includes information handling systems in accordance with one or more embodiments of the invention.

FIG. 1.3 shows a diagram of a chassis of an information handling systems in accordance with one or more embodiments of the invention.

FIG. 1.4 shows a side view of an information handling system in accordance with one or more embodiments of the invention.

FIG. 1.5 shows an example of a chilled air filter in accordance with one or more embodiments of the invention.

DETAILED DESCRIPTION

Figure 2:
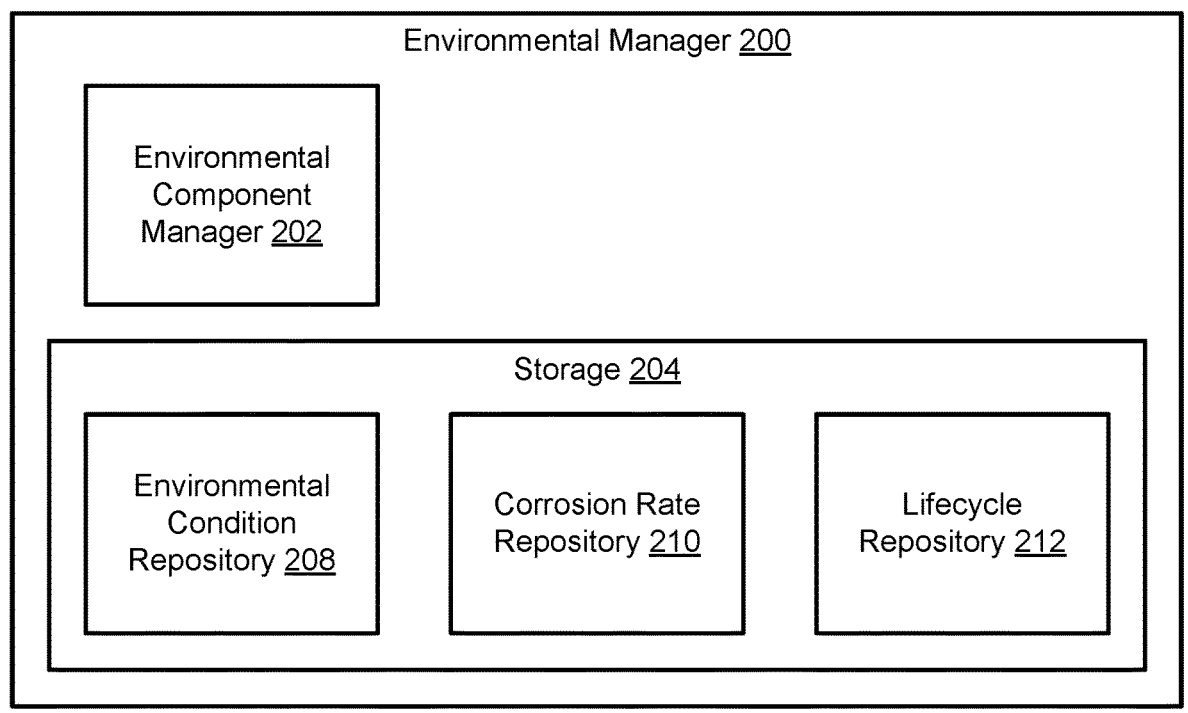
FIG. 2 shows a diagram of an environmental manager of an information handling system in accordance with one or more embodiments of the invention.

Specific embodiments will now be described with reference to the accompanying figures. In the following description, numerous details are set forth as examples of the invention. It will be understood by those skilled in the art that one or more embodiments of the present invention may be practiced without these specific details and that numerous variations or modifications may be possible without departing from the scope of the invention. Certain details known to those of ordinary skill in the art are omitted to avoid obscuring the description.

In the following description of the figures, any component described with regard to a figure, in various embodiments of the invention, may be equivalent to one or more like-named components described with regard to any other figure. For brevity, descriptions of these components will not be repeated with regard to each figure. Thus, each and every embodiment of the components of each figure is incorporated by reference and assumed to be optionally present within every other figure having one or more like-named components. Additionally, in accordance with various embodiments of the invention, any description of the components of a figure is to be interpreted as an optional embodiment, which may be implemented in addition to, in conjunction with, or in place of the embodiments described with regard to a corresponding like-named component in any other figure.

In general, embodiments of the invention relate to systems, devices, and methods for managing components of an information handling system. An information handling system may be a system that provides computer implemented services. These services may include, for example, database services, electronic communication services, data storage services, etc.

To provide these services, the information handling system may include one or more computing devices. The computing devices may include any number of computing components that facilitate providing of the services of the information handling system. The computing components may include, for example, processors, memory modules, circuit cards that interconnect these components, etc.

During operation, these components may generate heat and require gas flows to maintain the temperatures of these components within nominal ranges. However, these gases may cause corrosion. The corrosion may damage the corroded components. The damage may cause the components to fail and/or cause information handling system utilizing the components to fail.

Embodiments of the invention may provide methods and systems that manage corrosion. To manage corrosion, corrosive materials included in gases used for thermal management purposes may be filtered. By filtering the corrosive materials from the gases, the rates of corrosion of components thermally managed using the gases may be reduced. Consequently, the components may be more likely to meet their service life goals.

A system in accordance with embodiments of the invention may filter the gases on a granular level. For example, gases may be filtered on a chassis or IHS level. To granularly filter the gases, one or more chilled air filters may be utilized to selectively remove humidity (which may impact corrosion of components) from different portions of airflows. The chilled air filters may be integrated on a per-chassis level, multi-chassis level, or different level of granularity. By doing so, the gas filtering may be tailored to manage corrosion at a granular level.

By doing so, a system in accordance with embodiments of the invention may be less likely to prematurely fail or otherwise enter an undesirable corrosion state due to corrosion, be able to accept a wider range of gas compositions that may be more likely to cause corrosion without negatively impacting the system, and/or may be less costly to operate by reducing the necessary level of conditioning of gases (e.g., at a macro level) taken into chassis of information handling systems for thermal management purposes.

FIG. 1.1 shows an information handling system (10) in accordance with one or more embodiments of the invention. The system may include a frame (110) and any number of chassis (e.g., 100A, 100B, 100C).

The frame (110) may be a mechanical structure that enables chassis to be positioned with respect to one another. For example, the frame (110) may be a rack mount enclosure that enables chassis to be disposed within it. The frame (110) may be implemented as other types of structures adapted to house, position, orient, and/or otherwise physically, mechanically, electrically, and/or thermally manage chassis. By managing the chassis, the frame (110) may enable multiple chassis to be densely packed in space without negatively impacting the operation of the information handling system (10).

The frame may include a door (112). The door may include a chilled air filter (114) that enables gases to traverse into the interior of the frame (110). As will be discussed in greater detail below, the chilled air filter (114) may reduce the corrosiveness of gases that pass through it by removing content from those gases thereby making those gases less likely to corrode. Consequently, corrosion or other products generated inside of the frame (110) may be reduced by virtue of reduced corrosiveness of the gases.

While the door (112) is illustrated in FIG. 1.1 as including a single chilled air filter (114), a door in accordance with one or more embodiments of the invention may include any number of chilled air filters and/or other openings for enabling gases outside of the frame (110) to enter the frame. Additionally, while not illustrated in FIG. 1.1, any number of airflow directing components (e.g., baffles, ducts, etc.) may be included in the frame (110). These airflow directing components may selectively direct different portions of airflows taken into the frame through the door (112) to corresponding portions of the chassis and/or other components disposed in the frame. Consequently, various portions of airflows that have either been conditioned using a chilled air filter or not conditioned may be directed to different components within the frame (110). By doing so, the gases directed toward any of the components disposed within the frame (110) may be provided with gases having humidity levels tailored for different purposes.

For example, as discussed in greater detail below, the humidity levels of the portions of the gas flows directed towards components in the frame (110) may be tailored to manage corrosion of the respective components in a manner that enables the components to meet predetermined lifetime goals (e.g., a service life such as operate for 1, 2, 5, or different number of years without failing due to corrosion, among other possible failure modes). The rates of corrosion of various components disposed within the frame (110) may be heavily dependent on the relative humidity level of gases used to thermally manage (e.g., cool/remove heat/reduce temperature) components disposed within the frame (110). By tailoring the amount of humidity in airflows provided to these components for thermal management purposes, the corresponding rates of corrosion of these components may be managed on a granular level (e.g., per chassis, per component, per frame, etc.).

A chassis (e.g., 100A) may be a mechanical structure for housing components of an information handling system. For example, a chassis may be implemented as a rack mountable enclosure for housing components of an information handling system. The chassis may be adapted to be disposed within the frame (110) and/or utilize services provided by the frame (110) and/or other devices.

Any number of components may be disposed in each of the respective chassis (e.g., 100A, 100B, 100C). These components may be portions of computing devices that provide computer implemented services, discussed in greater detail below.

When the components provide computer implemented services, the components may generate heat. For example, the components may utilize electrical energy to perform computations and generate heat as a byproduct of performing the computations. If left unchecked, a buildup of heat within a chassis may cause temperatures of the components disposed within the chassis to exceed preferred ranges.

The preferred ranges may include a nominal range in which the components respectively operate: (i) without detriment and/or (ii) are likely to be able to continue to operate through a predetermined service life of a component. Consequently, it may be desirable to maintain the temperatures of the respective components within the preferred range (e.g., a nominal range).

When a component operates outside of the preferred range, the service life of the component may be reduced, the component may not be able to perform optimally (e.g., reduced ability to provide computations, higher likelihood of error introduced into computations, etc.), and/or the component may be more likely to unexpectedly fail. The component may be subject to other undesirable behavior when operating outside of the preferred range without departing from the invention.

To operate components within the preferred range of temperature, the chassis may include air exchanges (e.g., 102). An air exchange may be one or more openings in an exterior of a chassis that enables the chassis to exchange gases with an ambient environment. For example, a chassis may utilize air exchanges to (i) vent hot gases and (ii) intake cool gases. By doing so, the temperature of the gases within the chassis may be reduced. Consequently, the temperatures of components within the chassis may be reduced by utilizing the cooler gases taken into the chassis via an air exchange.

However, utilizing gases to cool components within a chassis may be problematic. The gases may not be benign, as noted above with respect to the chilled air filter (114). For example, the gases may be: (i) chemically reactive, (ii) include humidity, and/or (iii) otherwise interact with portions of the chassis and/or components disposed within the chassis in an undesirable manner. The reaction between the gases used to cool the components, portions of the chassis, and the components themselves (or other components proximate to the to-be-cooled components) may negatively impact the components disposed within the chassis and/or with the chassis itself.

For example, if the gases include a chemically reactive component (e.g., chlorine species), the gases may react (i.e., chemically react) with portions of the chassis and/or components disposed within the chassis. These reactions may: (i) generate corrosion on the portions of the chassis and/or (ii) generate corrosion on the components disposed within the chasses. This corrosion may (a) negatively impact the appearance of the chassis, (b) cause corrosion from the chassis to circulate within the chassis thereby potentially impacting the operation of components within the chassis, and/or (c) damage portions of the components disposed within the chassis directly resulting in a decreased service life of the components.

In another example, if the gases include humidity, the humidity may (under certain conditions) condense resulting in water (even at low levels) being disposed on the surfaces of the chassis and/or components. For example, when gases are taken into the chassis via an air exchange (102), water vapor may condense onto the surface of the air exchanger.

When water is disposed on the surface of the chassis and/or components (even at very small levels), the water may chemically react forming corrosion, albeit at a different rate when compared to chemically reactive species. The aforementioned reactions with the condensed water may damage the chassis, generate corrosion products that may circulate throughout the chassis, and/or damage the components (e.g., disposed within the chassis or outside of them) or otherwise cause them to operate in an undesirable manner. Compounding corrosion due to condensed humidity and chemically reactive species may be particularly problematic because a condensed layer of water on the components or chassis may preferentially absorb chemically reactive species which may amplify the corrosive impact of the chemically reactive species.

The potential reactions, discussed above, may cause numerous negative impacts. First, the reactions may impact the appearance of the chassis. The reaction products may have an unsightly appearance that makes the chassis look impaired to a viewer. Second, the reaction products may not be fixedly attached thereby resulting in reaction products circulating throughout the interior of the chassis. These products may be deposited in unpredictable manners throughout the chassis. When deposited, the reaction products may cause, for example, short circuits, changes in impedance of circuits, or otherwise impact the ability of other components to perform their functionalities.

Third, the reactions may impact the physical size of various components disposed within the chassis. For example, when metals chemically react, the products formed by the reactions may occupy significantly larger volumes than the unreacted metals (e.g., metal oxides vs elemental metals). The change in volumes of the reacted metals may negatively impact the electrical functionality of the components by, for example, forming open circuits by physically disconnecting various portions of the components from each other and/or other devices.

The potential reactions may cause other negative impacts beyond those discussed herein. The negative impacts may cause a device to fail prior to meeting its service life. A service life may be a desired duration of operation of a component, device, or system.

To address the above and/or other potential issues, embodiments of the invention may provide methods, devices, and systems that mitigate corrosion. To mitigate corrosion, chilled air filters may be used. A chilled air filter may be a structure that dehumidifies (i.e., dehumidifies) gases that makeup the airflow within the chassis. Specifically, chilled air filters (114) may be disposed at entrances to frames (e.g., chilled air filter (114). These chilled air filters may remove humidity (water content) from airflow thereby making the airflow less corrosive. By doing so, the rates of corrosion of chassis and/or components disposed within chassis may be reduced.

If the risk of corrosion is sufficiently high, even when chilled air filters are utilized, the system may automatically take steps to reduce the risk of corrosion. For example, the system may schedule activation and deactivation of chilled air filters or modify environmental conditions within a frame to reduce corrosion. However, modifying environmental conditions (e.g., activating an air cooling system that provides conditioned gases to multiple information handling systems) may utilize energy. Consequently, the system may preferentially avoid consuming energy for environmental management purposes if the risk of corrosion can be managed using chilled air filters.

In one or more embodiments of the invention, an information handling system environmental manager (119) may be implemented using a computing device programmed to (i) obtain information regarding the operation of the information handling system and/or one or more chassis therein and (ii) set the operating points of the chilled air filter (114). By doing so, the information handling system environmental manager (119) may cause the chilled air filter (114) to activate and remove humidity from airflow entering the information handling system.

To determine how to set the operating points of the chilled air filter, the information handling system environmental manager (119) may obtain and/or be provided information regarding the environmental conditions (e.g., temperatures, relative humidity levels, corrosion rates of components) within each of the chassis. For example, the information handling system environmental manager (119) may be operably connected to environmental managers of each of the chassis and/or the chilled air filter (114) via any combination of wired and/or wireless networks. The respective environmental managers of the chassis may provide such information to the information handling system environmental manager (119) and/or service requests regarding the operating points of the chilled air filter (114) via the operable connections.

The information handling system environmental manager (119) may be implemented using a computing device. For additional details regarding computing devices, refer to FIG. 4. The information handling system environmental manager (119) may perform all, or a portion, of the method illustrated in FIG. 3 while providing its functionality.

Figure 3:
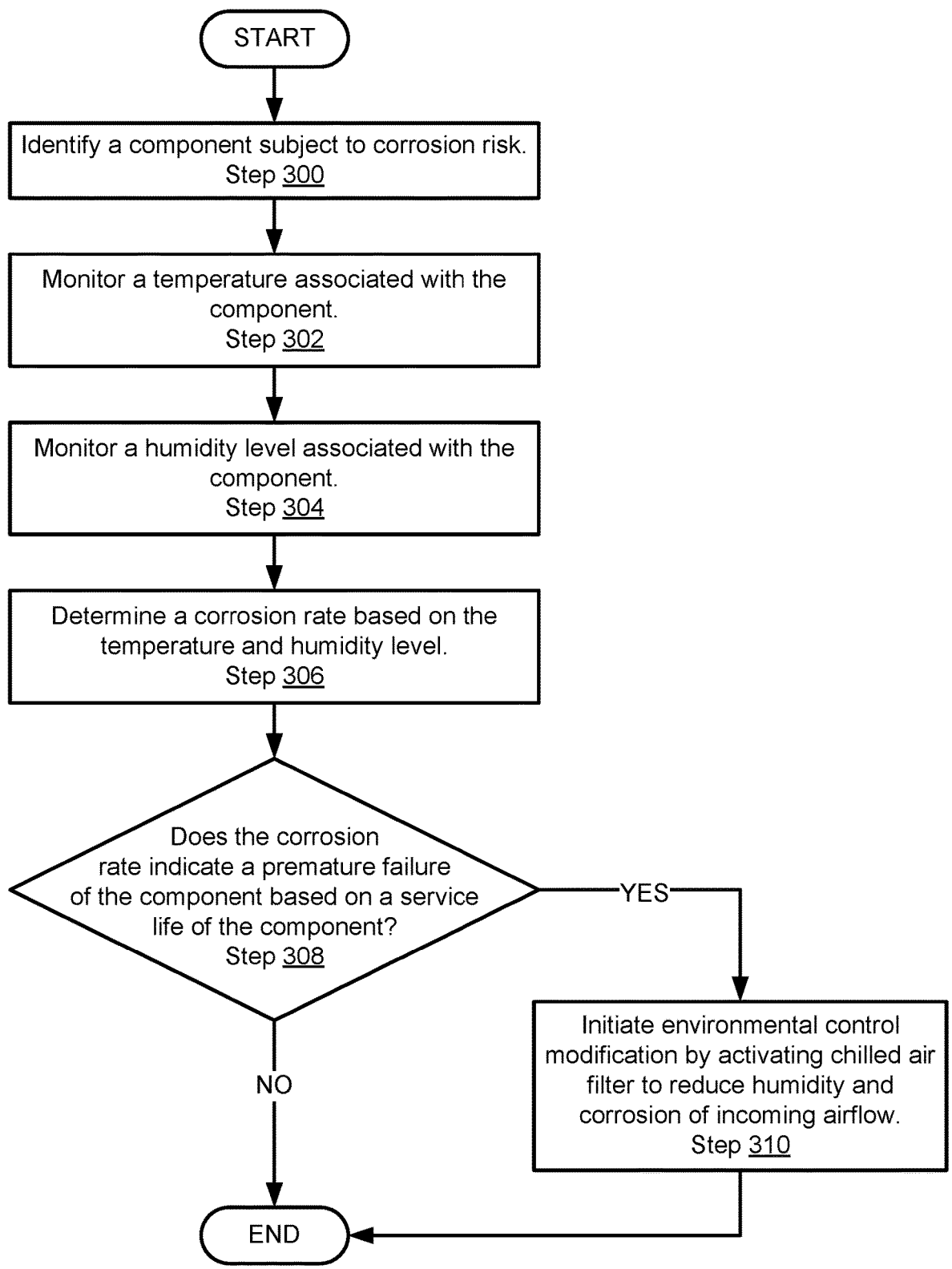
FIG. 3 shows a flowchart of a method of managing corrosion states in accordance with one or more embodiments of the invention.

For additional details regarding chilled air filter management and environment management, refer to FIGS. 2 and 3.

To further clarify the environments in which corrosion may arise, a diagram of an environment in which chassis of IHSs may reside is illustrated in FIG. 1.2 and a diagram of a chassis is provided in FIG. 1.3.

Turning to FIG. 1.2, FIG. 1.2 shows a top view diagram of a building (115) in which chassis of IHSs may reside in accordance with one or more embodiments of the invention. The building (115) may house a data center (e.g., an aggregation of information handling systems) that includes any number of information handling systems (e.g., 10A, 10B). The information handling systems may include chassis which may need to take in and exhaust gases for temperature regulation purposes due to heat generation by components disposed in the chassis.

To facilitate gas management within the building (115), the information handling systems may be organized into rows (or other groupings of information handling systems). In FIG. 1.2, the rows of information handling systems extend from top to bottom along the page. To enable gases to be provided to the information handling systems (e.g., for temperature regulation purposes), an airflow conditioner (120) may be disposed within the building. The airflow conditioner (120) may provide supply airflow (122) and take in a return airflow (124). These airflows are illustrated as arrows having dashed tails.

The supply airflow (122) may be at a lower temperature than the return airflow (124). Consequently, when information handling systems obtain portions of the supply airflow (122), the information handling systems may be able to utilize the supply airflow (122) to cool components disposed within the chassis of the information handling systems. For example, gases from the supply airflow (122) may be passed by components disposed within chassis of information handling systems that are at elevated temperatures. The gases may be at a lower temperature than the components. Consequently, thermal exchange between the gases and the components may decrease the temperature of the components.

After utilizing the gases from the supply airflow (122), the information handling systems may exhaust the gases as the return airflow (124). After being exhausted from the information handling systems, the return airflow (124) may be obtained by the airflow conditioner (120), cooled, and recirculated as the supply airflow (122).

In addition to cooling the return airflow (124), the airflow conditioner (120) may be capable of obtaining gases from other areas (e.g., outside of the building), reducing the humidity level of an airflow, and/or otherwise conditioning gases for use by information handling systems and/or other devices.

To manage the aforementioned process, a system environmental manager (130) may be disposed within the building (115) or at other locations. The system environmental manager (130) may be a computing device programmed to (i) obtain information regarding the operation of the information handling systems and (ii) set the operating points of the airflow conditioner (120). By doing so, the system environmental manager (130) may cause the airflow conditioner (120) to provide gases to the information handling systems having a temperature and/or humidity level that may better enable the information handling systems to regulate their respective environmental conditions within the chassis of the respective information handling systems. However, conditioning the supply airflow (122) may utilize large amounts of energy.

The airflow conditioner (120) may include functionality to granularly, or at a macro level, modify the temperature and/or humidity level of the supply airflow (122). Consequently, different information handling systems (or groups thereof) may receive different supply airflows (e.g., 122) having different characteristics (e.g., different temperatures and/or humidity levels, different sources, etc.).

Conditioning the return airflow (124) or gases obtained from outside of the building (115) may be costly, consume large amounts of electricity, or may otherwise be undesirable. To reduce these costs, the system environmental manager (130) may set the operating point (e.g., desired temperature/humidity levels of different portions of the supply airflow (122)) of the airflow conditioner (120) to only provide the minimum necessary characteristics required by each of the IHSs so that it meets is service life goals. By doing so, the cost of providing the supply airflow (122) having characteristics required to meet the environmental requirements of the chassis of the information handling systems may be reduced.

To decide how to set the operating points of the airflow conditioner (120), the system environmental manager (130) may obtain and/or be provided information regarding the environmental conditions (e.g., temperatures, relative humidity levels, corrosion rates of components) within each of the chassis. For example, the system environmental manager (130) may be operably connected to environmental managers of each of the chassis and/or the airflow conditioner (120) via any combination of wired and/or wireless networks. The respective environmental managers of the chassis may provide such information to the system environmental manager (130) and/or service requests regarding the operating points of the airflow conditioner (120) via the operable connections.

The system environmental manager (130) may be implemented using a computing device. For additional details regarding computing devices, refer to FIG. 4. The system environmental manager (130) may perform all, or a portion, of the method illustrated in FIG. 3 while providing its functionality.

Turning to FIG. 1.3, FIG. 1.3 shows a diagram of a chassis (100A) in accordance with one or more embodiments of the invention. A chassis may be a portion of an IHS and/or house all, or a portion, of an IHS. An information handling system may include a computing device that provides any number of services (e.g., computing implemented services). To provide services, the computing device may utilize computing resources provided by computing components (140). The computing components (140) may include, for example, processors, memory modules, storage devices, special purpose hardware, and/or other types of physical components that contribute to the operation of the computing device. For additional details regarding computing devices, refer to FIG. 4.

Because the computing device uses computing components (140) to provide services, the ability of the computing device to provide services is limited based on the number and/or quantity of computing devices that may be disposed within the chassis. For example, by adding additional processors, memory modules, and/or special purpose hardware devices, the computing device may be provided with additional computing resources which it may be used to provide services. Consequently, large number of computing components that each, respectively, generate heat may be disposed within the chassis.

To maintain the temperatures of the computing components (140) (and/or other types of components) within a nominal range, gases may be taken in through an air receiving exchange (142). The gases may be passed by the computing components (140) to exchange heat with them. The heated gases may then be expelled out of an air expelling exchange (144).

However, by taking in and expelling gases used for cooling purposes, the air receiving exchange (142), other portions of the chassis (100A) and/or components disposed within the chassis (100A) may be subject to degradation due to corrosion. For example, as discussed above, the gases may include components such as humidity or chemical species that may chemically react forming corrosion. Importantly, the combination of humidity that may condense on components and chemically reactive species that may be absorbed into the condensed humidity may be particularly problematic.

The chemical reaction products may form corrosion, cause corrosion products to circulate in the chassis (and/or outside of the chassis by being expelled as part of heated gases), and/or damage the structure and/or change the electrical properties of the computing components (140). These changes may negatively impact the ability of the computing device disposed in the chassis (100A) to provide its functionality.

For example, the computing device may have a service life during which it is expected that the computing device will be likely to provide its functionality. However, changes in the structure and/or electrical properties of these components due to exposure to humidity and/or chemically reactive specifies of the gases used for temperature regulation purposes may cause the components to prematurely fail ahead of the service life being met due to corrosion formation, change an appearance of the chassis by virtue of the presence of corrosion products, and/or otherwise negatively impact the chassis (100A) and/or components disposed within it.

In general, embodiments of the invention provide methods, devices, and systems for managing corrosion within chassis. To manage corrosion, a system in accordance with embodiments of the invention may: (i) modify corrosive materials to reduce their corrosiveness (e.g., by reducing humidity via a chilled air filter (114)), (ii) reduce the quantity of corrosive materials (e.g., via a filter), (iii) monitor the occurrence of corrosion (e.g., a corrosion state), and (iv) based on the monitored corrosion, activate one or more chilled air filters to modify the internal environment of a chassis and/or information handling system.

By doing so, embodiments of the invention may reduce the corrosion of chassis and/or components within chassis while limiting power consumption for gas conditioning purposes. By doing so, the computing devices disposed within chassis (e.g., 100A) may be more likely to meet their respective service life goals, have lower operation costs, and/or require fewer repairs during their respective service lives.

To manage the internal environment (104) of the chassis, the chassis (100A) may include a chassis environmental manager (150). The chassis environmental manager (150) may provide environmental management services. Environmental management services may include: (i) obtaining information regarding the rates of corrosion of the chassis, chilled air filters, and/or component within chassis, (ii) determining, based on the corrosion rates, whether service life goals are likely to be impacted by the corrosion, (iii) initiating activation of chilled air filters when the monitoring indicates that the chilled air filters are unable to continue filtering corrosive materials, (iv) modifying the operation (e.g., modifying operating points) of environmental control components (152) to reduce corrosion and/or reduce the amount of power consumed for environmental management purposes, and/or (v) communicate and/or control a chilled air filter of the information handling system to reduce the corrosiveness of the airflow and gases within the chassis. For additional details regarding the chassis environmental manager (150), refer to FIG. 2.

While illustrated in FIG. 1.3 as a physical structure, as will be discussed with respect to FIG. 2, the chassis environmental manager (150) may be implemented as a logical entity (e.g., a program executing using the computing components (140)). For example, a computing device disposed in the chassis (or other locations) may host an application (e.g., executable computer instructions being executed by a processor) that provides the functionality of the chassis environmental manager (150).

To enable the chassis environmental manager (150) to provide its functionality, the chassis (100A) may include one or more detectors (e.g., 154, 156). These detectors may enable the rates of corrosion of various components (e.g., portions of the chassis, computing components, etc.) to be determined and/or environmental conditions within and/or proximate to the chassis to be determined. These detectors may be implemented as sensors or other types of physical devices that are operably connected to the chassis environmental manager (150). Any number of corrosion detectors (e.g., 154), temperature detectors (e.g., 156), humidity detectors (e.g., 156), and/or other types of detectors (e.g., corrosion detectors that directly measure corrosion rates and/or absolute amounts of corrosion) may be disposed at any number of locations throughout the chassis (100A).

In some embodiments of the invention, the functionality of a temperature detector may be provided by, in all or in part, the computing components (140). For example, the computing components (140) may include functionality to report their respective temperatures and/or humidity levels of the internal environment (104) of the chassis (100A).

The chassis (100A) may also include environmental control components (152). The environmental control components (152) may include physical devices that include functionality to modify characteristics (e.g., temperature, humidity level, airflow rates/directions) of the internal environment (104) of the chassis (100A). The chassis (100A) may include any number of environmental control components disposed at any number of locations within the chassis.

For example, the environmental control components (152) may include gas movers such as fans. The fans may be able to modify the rate of gases being taken into and expelled from the chassis (100A) through the air exchangers (e.g., 102). The rate of intake and exhaust of gases may cause an airflow to be generated within the internal environment (104). The airflow may be used to modify the rate of thermal exchange between the computing components (140) and the internal environment (104) (e.g., an environment proximate to the computing components (140)).

As an additional example, the environmental control components (152) may include components that are not disposed in the chassis (not shown). For example, the environmental control components may include an airflow conditioner discussed with respect to FIG. 1.2. These external components may be used in conjunction with the environment control components disposed within the chassis to manage the temperature and/or relative humidity levels throughout the internal environment (104) of the chassis as well as those of gases as they are taken into and/or expelled by the chassis (100A).

The chassis (100A) may include any number and type of environmental control components without departing from the invention. Any of the environmental control components may be implemented using physical devices operably connected to and/or controllable by the chassis environmental manager (150) and/or a system environmental manager (e.g., 130, FIG. 1.2) (alone or in combination). Any number of chassis environmental managers and system environmental managers may cooperatively operate to control the temperature and/or relative humidity levels to control the rate of corrosion occurring within the chassis and/or manage the thermal load generated by the computing components (140) and/or other components.

To cooperatively operate, the chassis environmental managers, the information handling system environmental manager, and the system environmental managers may be operably connected to each another (e.g., via wired and/or wireless networks). The aforementioned components may share information with one another (e.g., detector data, operating set points of different environmental control components, etc.). These components may implement any type of model for controlling and/or delegating control of the system for temperature, relative humidity level, and/or corrosion rate management purposes. When providing their respective functionalities, these components may perform all, or a portion, of the method illustrated in FIG. 3. Additionally, any capability and functionality described herein with respect to any specific environmental manager may be performed by any of the disclosed environmental managers (i.e., the chassis environmental managers, the information handling system environmental manager, and the system environmental managers). Any of these components may be implemented using a computing device. For additional details regarding computing devices, refer to FIG. 4.

While the chassis (100A) of FIG. 1.3 has been illustrated as including a limited number of specific components, a chassis in accordance with one or more embodiments of the invention may include additional, fewer, and/or different components without departing from the invention. Additionally, while the chassis (100A) is illustrated as having a specific form factor (e.g., rack mount), a chassis in accordance with embodiments of the invention may have different form factors without departing from the invention.

As discussed above, the chassis (100A) may include one or more chilled air filters (e.g., disposed where gases enter an information handling system, etc.). The chilled air filters may be used to reduce the quantity of corrosive materials in gases (e.g., by removing water content of the gas and reducing humidity). Consequently, components exposed to the gases may corrode at reduced rates when compared to gases that have not been filtered.

Turning to FIG. 1.4, FIG. 1.4 shows a diagram of a side view of an information handling system. In one or more embodiments of the invention, airflow (172) is forced into the information handling system (10) via the chilled air filter (114). Specifically, in one or more embodiments of the invention, a door (112) is placed on the front side of the IHS (10) (i.e., the side where airflow (172) enters the information handling system (10)), with an opening through a chilled air filter (114). Accordingly, most (or at least a majority by volume of) airflow that enters information handling system (10) must pass through the chilled air filter (114) before passing through one or more chassis (100A, 100B, 100C).

In some embodiments of the invention, other airflows (not shown) may be allowed to flow through the door (112) through other openings (not shown). These other airflows and the airflow (172) may be selectively directed towards different chassis and/or other components (not shown). Consequently, different components of the IHS may receive the airflow (172) that is impacted by the chilled air filter (114) and other components may receive other airflows (not shown) that are not impacted by the chilled air filter (114). For example, different portions of the airflow (172) may be directed, after traversing the chilled air filter, to some of the chassis that include components that are sensitive to corrosion (e.g., may prematurely fail due to corrosion) while the other airflows (not shown) may be directed to other chassis (and/or other components) that are insensitive to corrosion (e.g., may be unlikely to fail due to corrosion).

In one or more embodiments of the invention, the chilled air filter removes water content from the gases that flow through it. Specifically, in one embodiment of the invention, the chilled air filter (114) may be a condenser that includes a cooled liquid (colder than the airflow) thereby creating condensation when the airflow is exposed to the chilled air filter (114). The condensation is then gathered and removed from the airflow thereby resulting in airflow that is less humid and therefore less likely to cause corrosion. Additional detail regarding the chilled air filter (114) may be found in the description of FIG. 1.5.

Turning to FIG. 1.5, FIG. 1.5 shows an example of a chilled air filter of an information handling system. In one or more embodiments of the invention, the chilled air filter may take the form of a condenser, where cooled liquid (175) (i.e., liquid cooler than airflow (172)) passes through a pipe that is exposed to airflow (172). In turn, the gases of airflow (172) interact with the surface of the chilled air filter (114), and due to the temperature differential, the gases leave condensation (174) (i.e., water vapor/moisture from airflow (172)) on the surface of the pipes of the chilled air filter (114).

In one or more embodiments of the invention, the building (e.g., 115 of FIG. 1.2) may include a network of pipes (not shown) to supply the cooled liquid (175) to the chilled air filter (114). Further, in one or more embodiments of the invention, the building (e.g., 115 of FIG. 1.2) may provide a network of pipes (not shown) to drain condensation (174) from the chilled air filter (114). Other processes and/or mechanisms for providing the cooled liquid and/or the draining condensation may be implemented without departing from the invention.

FIG. 2 shows a diagram of an environmental manager (200) in accordance with one or more embodiments of the invention. The information handling system environmental manager (119), the system environmental manager (130), and/or chassis environmental manager (150) illustrated in FIGS. 1.1, 1.2, and 1.3, respectively, may be similar to the environmental manager (200).

As discussed above, the environmental manager (200) may provide environmental management services. Environmental management services may reduce the likelihood that IHSs fail prematurely (e.g., prior to meeting service life goals) due to corrosion.

In one or more embodiments of the invention, the environmental manager (200) is implemented using computing devices. The computing devices may be, for example, mobile phones, tablet computers, laptop computers, desktop computers, servers, distributed computing systems, embedded computing devices, or a cloud resource. The computing devices may include one or more processors, memory (e.g., random access memory), and persistent storage (e.g., disk drives, solid state drives, etc.). The persistent storage may store computer instructions, e.g., computer code, that (when executed by the processor(s) of the computing device) cause the computing device to provide the functionality of the environmental manager (200) described through this application and all, or a portion, of the method illustrated in FIG. 3. The environmental manager (200) may be implemented using other types of computing devices without departing from the invention. For additional details regarding computing devices, refer to FIG. 4.

In one or more embodiments of the invention, the environmental manager (200) is implemented using distributed computing devices. As used herein, a distributed computing device refers to functionality provided by a logical device that utilizes the computing resources of one or more separate and/or distinct computing devices. For example, in one or more embodiments of the invention, the environmental manager (200) is implemented using distributed devices that include components distributed across any number of separate and/or distinct computing devices. In such a scenario, the functionality of the environmental manager (200) may be performed by multiple, different computing devices without departing from the invention.

To provide environmental management services, the environmental manager (200) may include an environmental component manager (202) and a storage (204). Each of these components is discussed below.

The environmental component manager (202) may manage chilled air filters and/or environmental control components that may be used to control the characteristics (e.g., temperature, humidity level, airflow rates, quantities of corrosive materials included in gases used for thermal management purposes, etc.) of the environment within a chassis. To manage them, the environmental component manager (202) may (i) obtain information regarding the environmental conditions including temperatures, humidity levels, airflow rates, and/or corrosion rates, (ii) determine, using the environmental information, whether the IHS is likely to prematurely fail due to corrosion due to these conditions, (iii) if the IHS is likely to fail, modify the environmental conditions to reduce corrosion by activating the chilled air filter and/or modifying the operation of environmental control components, and/or (iv) if the IHS is unlikely to fail, modify the operation of environmental control components to reduce energy consumption used to condition gases for thermal management purposes (e.g., at the cost of potentially increased rates of corrosion).

To obtain information regarding the environmental conditions, the environmental component manager (202) may request such information from computing components (e.g., temperatures), detectors (e.g., corrosion, temperature, humidity, and/or other types of sensors), and/or other types of devices (e.g., components external to the chassis). In response, the aforementioned components may provide the requested information to the environmental component manager (202). The environmental component manager (202) may store the aforementioned information as part of an environmental condition repository (208).

To ascertain whether an IHS is likely to prematurely fail due to corrosion, the environmental component manager (202) may estimate a total amount of corrosion of different portions of a chassis and/or components disposed within a chassis that has likely occurred, estimate the rate that corrosion will occur in the future, and use the previous amount and current rate to determine whether corrosion management components are able to continue to provide corrosion management services sufficient to meet the service life goals of the IHS.

To generate the estimates, the environmental component manager (202) may take into account the historical environmental conditions. For example, the environmental component manager (202) may use predictive models to estimate future corrosion of components based on historical rates of corrosion.

Utilizing these estimates, the environmental component manager (202) may determine whether the IHS is unlikely to meet its service life goal due to corrosion. To make this determination, the environmental component manager (202) may utilize a lifecycle repository (212). The lifecycle repository (212) may specify information that may be used to ascertain whether a premature failure will occur based on corrosion.

For example, the lifecycle repository (212) may specify a total amount of corrosion that will cause various components (e.g., computing components) to no longer be able to provide their respective functionalities. Based on these corrosion amounts and the corrosion estimates, the environmental component manager (202) may ascertain whether the any of these components will be unlikely to provide their functionalities prior to the IHS meeting its service life goals.

If it is determined that the IHS will prematurely fail due to corrosion, the environmental component manager (202) may orchestrate activation of the chilled air filter. The environmental components manager (202) may do so by sending an electronic message to the information handling system environmental manager. In response, the information handling system environmental manager may activate the chilled air filter. Consequently, the activated chilled air filter may reduce the rates of corrosion by removing water content (i.e., humidity) from the internal environments of chassis.

When providing its functionality, the environmental component manager (202) may utilize the storage (204) by storing and using previously stored data structures.

To provide the above noted functionality of the environmental component manager (202), the environmental component manager (202) may perform all, or a portion, of the method illustrated in FIG. 3.

In one or more embodiments of the invention, the environmental component manager (202) may be implemented using a hardware device including circuitry. The environmental component manager (202) may be implemented using, for example, a digital signal processor, a field programmable gate array, or an application specific integrated circuit. The environmental component manager (202) may be implemented using other types of hardware devices without departing from the invention.

In one or more embodiments of the invention, the environmental component manager (202) is implemented using computing code stored on a persistent storage that when executed by a processor performs all, or a portion, of the functionality of the environmental component manager (202). The processor may be a hardware processor including circuitry such as, for example, a central processing unit or a microcontroller. The processor may be other types of hardware devices for processing digital information without departing from the invention.

In one or more embodiments disclosed herein, the storage (204) is implemented using devices that provide data storage services (e.g., storing data and providing copies of previously stored data). The devices that provide data storage services may include hardware devices and/or logical devices. For example, storage (204) may include any quantity and/or combination of memory devices (i.e., volatile storage), long term storage devices (i.e., persistent storage), other types of hardware devices that may provide short term and/or long term data storage services, and/or logical storage devices (e.g., virtual persistent storage/virtual volatile storage).

For example, storage (204) may include a memory device (e.g., a dual in line memory device) in which data is stored and from which copies of previously stored data are provided. In another example, storage (204) may include a persistent storage device (e.g., a solid state disk drive) in which data is stored and from which copies of previously stored data are provided. In a still further example, storage (204) may include (i) a memory device (e.g., a dual in line memory device) in which data is stored and from which copies of previously stored data are provided and (ii) a persistent storage device that stores a copy of the data stored in the memory device (e.g., to provide a copy of the data in the event that power loss or other issues with the memory device that may impact its ability to maintain the copy of the data cause the memory device to lose the data).

The storage (204) may store data structures including an environmental condition repository (208), a corrosion rate repository (210), and a lifecycle repository (212). Each of these data structures is discussed below.

The environmental condition repository (208) may include one or more data structures that include information regarding the environmental conditions associated with a chassis, chilled air filter, and/or another type of component (e.g., a computing component). For example, when temperature, humidity, airflow rate, and/or corrosion data is read from a detector, the read information may be stored in the environmental condition repository (208). Consequently, a historical record of the environmental conditions associated with these components may be maintained.

The environmental condition repository (208) may include any type and quantity of information regarding the environmental conditions associated with these components. For example, the environmental condition repository (208) may include temperature sensor data from discrete temperature sensors and/or temperature sensors integrated into computing components (and/or other types of devices). In another example, the environmental condition repository (208) may include corrosion rates obtained from discrete or integrated corrosion sensors (e.g., on board a circuit card). In a still further example, the environmental condition repository (208) may include airflow rate data regarding the flow of gases within a chassis.

In addition to the sensor data, the environmental condition repository (208) may include spatial data regarding the relative locations of these components with respect to the locations of the detectors. For example, some of these components may be disposed away from the detectors. Consequently, it may not be possible to directly measure the temperature, relative humidity level, airflow rates, and/or corrosion of these components. The spatial data may be used to estimate, using measured temperatures and/or corrosion, the likely corrosion rates of these components.

The corrosion rate repository (210) may include one or more data structures that include information regarding the rates at which various components have corroded. For example, the corrosion rate repository (210) may include tables associated with chilled air filters, chassis, and/or other types of components disposed in chassis. Each of these tables may include the measured and/or estimated corrosion of these components.

The tables may also include the time at which the corrosion was measured. Consequently, the rates of corrosion of these components may be ascertained using the information included in the tables (e.g., corrosion at time T1−corrosion at time T2/the different between T1 and T2).

The lifecycle repository (212) may include one or more data structures that include information regarding the desired life of an information handling system. For example, the lifecycle repository (212) may specify how much corrosion may occur with respect to different components (e.g., portions of a chassis, chilled air filters, computing components, etc.) before the respective components are likely to fail and/or the IHS is likely to fail due to downstream impacts of corrosion. The aforementioned information may be used in conjunction with determined corrosion rates and quantities of corrosion included in the corrosion rate repository (210) to determine whether it is likely that a component, computing device, and/or IHS is likely to fail prior to its desired service life.

While the data structures stored in storage (204) have been described as including a limited amount of specific information, any of the data structures stored in storage (204) may include additional, less, and/or different information without departing from the embodiments disclosed herein. Further, the aforementioned data structures may be combined, subdivided into any number of data structures, may be stored in other locations (e.g., in a storage hosted by another device), and/or spanned across any number of devices without departing from the embodiments disclosed herein. Any of these data structures may be implemented using, for example, lists, table, linked lists, databases, or any other type of data structures usable for storage of the aforementioned information.

While the environmental manager (200) of FIG. 2 has been described and illustrated as including a limited number of specific components for the sake of brevity, an environmental manager in accordance with embodiments of the invention may include additional, fewer, and/or different components than those illustrated in FIG. 2 without departing from the invention.

Further, any of the components may be implemented as a service spanning multiple devices. For example, multiple computing devices housed in multiple chassis may each run respective instances of the environmental component manager (202). Each of these instances may communicate and cooperate to provide the functionality of the environmental component manager (202).

As discussed above with respect to FIG. 2, the environmental manager (200) may provide corrosion management services. FIG. 3 illustrates a method that may be performed by the environmental manager (200) of FIG. 2 when providing corrosion management services.

FIG. 3 shows a flowchart of a method in accordance with one or more embodiments of the invention. The method depicted in FIG. 3 may be used to manage a chassis environment in accordance with one or more embodiments of the invention. The method shown in FIG. 3 may be performed by, for example, a chassis environmental manager (e.g., 150, FIG. 1.3). Other components of the system illustrated in FIGS. 1.1-1.4 may perform all, or a portion, of the method of FIG. 3 without departing from the invention.

While FIG. 3 is illustrated as a series of steps, any of the steps may be omitted, performed in a different order, additional steps may be included, and/or any or all of the steps may be performed in a parallel and/or partially overlapping manner without departing from the invention.

In step 300, a component subject to corrosion risk is identified. The component may be, for example, a computing component disposed within a chassis. The component may be identified based on a listing or other data structure of components for which an environmental manager is to provide environmental management services.

In step 302, a temperature associated with the component is monitored. The temperature associated with the component may be monitored using, for example, a sensor. The sensor may report the ambient temperature adjacent to the component or a temperature from which the ambient temperature adjacent to the component may be ascertained. The monitoring may be performed for any duration of time.

The sensor may be integrated into the component or may be separate from the component. For example, if the component includes an integrated temperature sensor, the component may provide the temperature associated with the component to an environmental manager.

In step 304, a humidity level associated with the component is monitored. The humidity level associated with the component may be monitored using, for example, a sensor. The sensor may report the relative humidity level adjacent to the component or a humidity level from which the ambient temperature adjacent to the component may be ascertained. For example, if the humidity level is known at a location upstream from the component, the humidity level proximate to the component may be determined based on modeling of the changes in temperature and humidity downstream of the measured location. Further, in some embodiments, if the humidity level and a temperature is known upstream of the component and the temperature is known at the component, an accurate estimate of the relative humidity level at the component may be ascertained based on the change in temperature between the locations. Like the monitoring of the temperature of step 302, the monitoring of the humidity level may be performed for any duration of time.

The sensor used to obtain the humidity level may be integrated into the component or may be separate from the component. For example, if the component includes an integrated humidity sensor, the component may provide the relative humidity level associated with the component to an environmental manager.

In step 306, a corrosion rate based on the temperature and humidity level is determined. The corrosion rate may be determined, as discussed with respect to FIG. 2, using a corrosion rate repository that specifies the corrosion rate of the component as a function of temperature and relative humidity level. In other words, a functional relationship between corrosion rate and the combination of temperature and humidity level may be known for the component.

The aforementioned functional relationship may be ascertained via laboratory measurement. For example, a component that may be subject to corrosion risk may be exposed to different temperature and relative humidity level ratios. The quantity of corrosion that occurred during the exposure may then be used to determine the corresponding corrosion rates for the component. The aforementioned relationships may be stored in storage of the environmental manager prior to it performing its functionality disclosed herein.

In some embodiments of the invention, steps 302-306 may be performed using a corrosion detector that directly measures a corrosion rate (rather than measuring temperature, humidity, and determining corrosion rate based on the temperature and humidity level). The detector may include a sensor that directly measures rates of corrosion using any sensing methodology without departing from the invention.

In step 308, it is determined whether the corrosion rate indicates that a premature failure of the component is likely to occur based on the service life of the component. The determination may be made by comparing the amount of corrosion of the component that has occurred and the corrosion rate to a maximum amount of corrosion that can occur before failure of the component is likely. In other words, solving the equation $C_f = C_c + T*C_r$ where $C_f$ is the amount of corrosion that can occur before premature failure is likely to occur, $C_c$ is the amount of corrosion that has already occurred, $C_r$ is the corrosion rate determined in step 306, and T is the unknown amount of time until premature failure will occur due to corrosion. If the amount of time until premature failure indicates that failure of the component will occur before the desired service life of the component occurs, it is determined that the corrosion rates indicates a premature failure of the component will occur.

In one or more embodiments of the invention, the determination is made by estimating the future rates of corrosion (and/or total amounts of corrosion) using a predictive model. The predictive model may be, for example, machine learning, a stochastic method, a regression technique (e.g., linear regression/curve fitting), or any other method of using historical data to predict future data.

The historical corrosion and/or corrosion rates obtained in step 306 may be used as training data to train a predictive model. For example, the environmental conditions during a first period of time may be associated with rates of corrosion that occur in a second period of time in the future (e.g., a present to future relationship). Alternatively or complementary, the rates of corrosion during a first period of time may be associated with rates of corrosion that occur in a second, future period of time. These rates may be used as the training basis for the predictive model.

The predictive model may be used to then predict the future levels of corrosion of the component based on the historical data (e.g., using the trained model). The predicted future levels of corrosion may specify, for example, the amount of corrosion of the component at different points in the future and/or the rates of change of the corrosion at different points in time in the future based on environmental conditions and/or rates of corrosion that have been measured.

These predictions may be used to ascertain when the corrosion risk of the component indicates a premature failure (e.g., whether the component will fail prior to meeting service life goals). If the component will not meet is service life goals based on the prediction, the corrosion risk may indicate the premature failure of the component.

If it is determined that a premature failure will occur, the method may proceed to step 310. If not, it is determined that a premature failure will not occur, and the method may end following step 308.

In step 310, an environmental control modification that mitigates the premature failure is initiated. In one or more embodiments of the invention, the environmental control modification is a command to initiate a process that will decrease the humidity of the internal environment of the chassis. Generally, the rate of corrosion of a component increases greatly as the relative level of humidity increases (in the environment proximate to the component). Accordingly, the level of relative humidity proximate to the component may be decreased by (i) increasing the temperature of the airflow or (ii) removing water vapor (i.e., moisture) from the airflow.

In one or more embodiments of the invention, the environmental control modification is to initiate activation of the chilled air filter of the information handling system that includes the chassis with the component that is determined likely to prematurely fail (at step 308). To initiate activation of the chilled air filter, the chassis environmental manager sends a command (e.g., data) to the information handling system environmental manager to start the chilled air filter. In turn, upon receiving the command from the chassis environmental manager, the information handling system environmental manager activates the chilled air filter, which then begins dehumidifying the airflow. In one or more embodiments of the invention, the information handling system environmental manager may activate the chilled air filter by (i) initiating power to a pump of the cooled liquid that flows through the chilled air filter or (ii) initiating the opening of a valve to allow cooled liquid to flow through the chilled air filter. In one or more embodiments of the invention, the chassis environmental manager may directly control the chilled air filter, without interacting with the information handling system environmental manager and therefore may perform some or all of the functions of the information handling system environmental manager independently.

In one or more embodiments of the invention, the environment control modification is implemented when the component's temperature, actual humidity, and/or relative humidity exceeds preferred temperature and/or humidity ranges. For example, when the component's measured (or calculated) relative humidity is likely to cause corrosion at rates that lead to premature failure of the component, the environmental control modification may be implemented. As another example, if the corrosion risk is determined to be low (e.g., corrosion occurring at a rate that is unlikely to cause the component to prematurely fail), an environmental manager in accordance with embodiments of the invention may leave the chilled air filter in a (default) deactivated mode (e.g., an inactive state which reduces power consumption by the hilled air filter). However, if the relative humidity is later measured/calculated to exceed the nominal range, the chilled air filter may then be activated (e.g., an active state that consumes power to reduce humidity). Similarly, if the chilled air filter is currently active, and the chassis environmental manager measures/calculates that the relative humidity is below a nominal threshold, the chassis environmental manager may deactivate, or initiate deactivation of, the chilled air filter.

The method may end following step 310.

Figure 4:
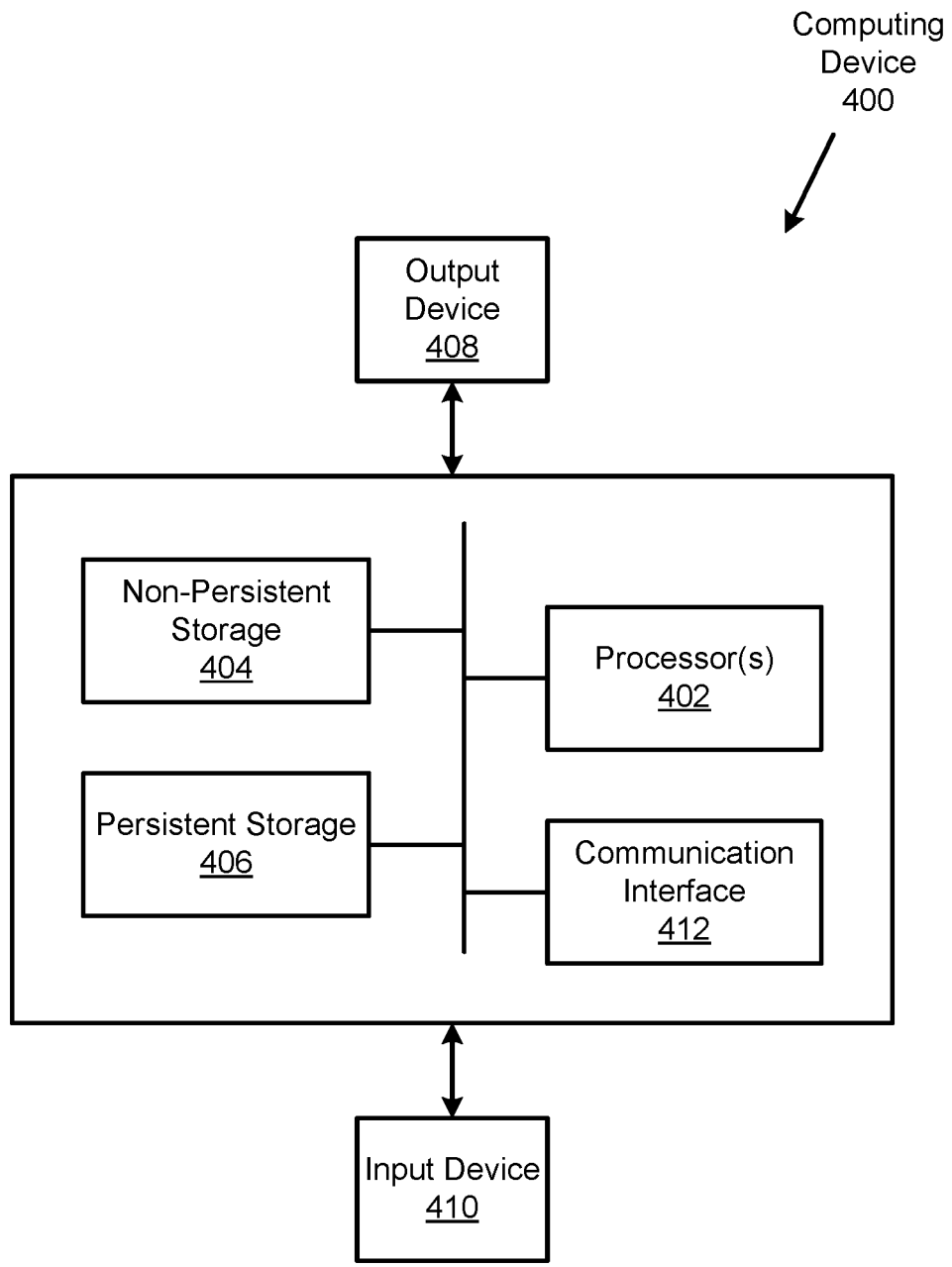
FIG. 4 shows a diagram of a computing device in accordance with one or more embodiments of the invention.

Embodiments of the invention may be implemented using a computing device. FIG. 4 shows a diagram of a computing device in accordance with one or more embodiments of the invention. The computing device (400) may include one or more computer processors (402), non-persistent storage (404) (e.g., volatile memory, such as random access memory (RAM), cache memory), persistent storage (406) (e.g., a hard disk, an optical drive such as a compact disk (CD) drive or digital versatile disk (DVD) drive, a flash memory, etc.), a communication interface (412) (e.g., Bluetooth interface, infrared interface, network interface, optical interface, etc.), input devices (410), output devices (408), and numerous other elements (not shown) and functionalities. Each of these components is described below.

In one embodiment of the invention, the computer processor(s) (402) may be an integrated circuit for processing instructions. For example, the computer processor(s) may be one or more cores or micro-cores of a processor. The computing device (400) may also include one or more input devices (410), such as a touchscreen, keyboard, mouse, microphone, touchpad, electronic pen, or any other type of input device. Further, the communication interface (412) may include an integrated circuit for connecting the computing device (400) to a network (not shown) (e.g., a local area network (LAN), a wide area network (WAN) such as the Internet, mobile network, or any other type of network) and/or to another device, such as another computing device.

In one embodiment of the invention, the computing device (400) may include one or more output devices (408), such as a screen (e.g., a liquid crystal display (LCD), a plasma display, touchscreen, cathode ray tube (CRT) monitor, projector, or other display device), a printer, external storage, or any other output device. One or more of the output devices may be the same or different from the input device(s). The input and output device(s) may be locally or remotely connected to the computer processor(s) (402), non-persistent storage (404), and persistent storage (406). Many different types of computing devices exist, and the aforementioned input and output device(s) may take other forms.

Embodiments of the invention may provide an improved method for managing components of an information handling system. Specifically, embodiments of the invention may provide a method and device for managing corrosion that may cause components of an information handling system to fail. To do so, embodiments of the invention may provide a system that includes a chilled air filter. The chilled air filter may reduce humidity of gases used for thermal management purposes. By doing so, corrosion of components thermally managed using the gases may be reduced by reducing exposure to corrosive materials.

Thus, embodiments of the invention may address the problem of environments that may cause undesired corrosion. Specifically, embodiments of the invention may provide a method of managing corrosion that enables less power to be consumed for environmental conditioning purposes while still mitigating the impacts of corrosion.

For example, by selectively dehumidifying gases used for thermal management of corrosion sensitive components, less power may be consumed by reducing or eliminating conditioning of gases used for thermally managing both corrosion sensitive and corrosion insensitive components.

The problems discussed above should be understood as being examples of problems solved by embodiments of the invention disclosed herein and the invention should not be limited to solving the same/similar problems. The disclosed invention is broadly applicable to address a range of problems beyond those discussed herein.

One or more embodiments of the invention may be implemented using instructions executed by one or more processors of the computing device (400). Further, such instructions may correspond to computer readable instructions that are stored on one or more non-transitory computer readable mediums.

While the invention has been described above with respect to a limited number of embodiments, those skilled in the art, having the benefit of this disclosure, will appreciate that other embodiments can be devised which do not depart from the scope of the invention as disclosed herein. Accordingly, the scope of the invention should be limited only by the attached claims.

What is claimed is:

1. An information handling system comprising a computing device, the information handling system comprising:
    a computing component of the computing device that is housed in a chassis; and
    a chilled air filter adapted to reduce a humidity level of a portion of an airflow when the chilled air filter is in an active state, wherein the portion of the airflow is adapted to thermally manage the computing component,
    wherein the airflow is:
        received by the chassis via an air receiving exchange, and
        exhausted by the chassis via an air expelling exchange,
    wherein the chilled air filter is further adapted to reduce a second humidity level of a second portion of the airflow, wherein the second portion of the airflow is adapted to thermally manage a second computing component of a second computing device housed in a second chassis when the chilled air filter is in the active state.

2. The information handling system of claim 1, further comprising:
    a chassis environmental manager programmed to:
        obtain a corrosion rate of the computing component;
        make a determination that the corrosion rate indicates a premature failure of the computing component based on a service life of the computing component; and
        in response to the determination:
            initiate an environmental control modification using the chilled air filter to mitigate the premature failure by reducing the corrosion rate of the computing component.

3. The information handling system of claim 2, wherein initiating the environmental control modification comprises:
    transitioning the chilled air filter from an inactive state to the active state, wherein the chilled air filter is not adapted to reduce the humidity level while in the inactive state.

4. The information handling system of claim 3, wherein the chassis environmental manager is further programmed to:
    after initiating the environmental control modification:
        make a second determination that the humidity level and a temperature associated with the computing component are within a nominal threshold; and
        in response to the second determination:
            transition the chilled air filter to the inactive state.

5. The information handling system of claim 1, wherein the chilled air filter is disposed in a portion of information handling system through which the airflow traverses.

6. The information handling system of claim 1, wherein the computing component is a trace of a circuit card.

7. The information handling system of claim 6, wherein the corrosion rate is obtained using a humidity sensor integrated into the computing component, wherein the computing component is operably connected to an integrated circuit.

8. A method for environmentally managing an information handling system comprising a computing device, comprising:
    thermally managing, using a portion of an airflow, a computing component of the computing device that is housed in a chassis; and
    reducing a humidity level of the portion of the airflow using a chilled air filter while:
        the chilled air filter is in an active state, and
        the computing component is being thermally managed by the portion of the airflow,
    wherein the portion of the airflow is:
        received by the chassis via an air receiving exchange, and
        exhausted by the chassis via an air expelling exchange,
    reducing, using the chilled air filter, a second humidity level of a second portion of the airflow while the second portion of the airflow thermally manages a second computing component of a second computing device housed in a second chassis while the chilled air filter in the active state.

9. The method of claim 8, further comprising:
    obtaining, by a chassis environmental manager, a corrosion rate of the computing component;
    making, by the chassis environmental manager, a determination that the corrosion rate indicates a premature failure of the computing component based on a service life of the computing component; and
    in response to the determination:
        initiating, by the chassis environmental manager, an environmental control modification using the chilled air filter to mitigate the premature failure by reducing the corrosion rate of the computing component.

10. The method of claim 9, wherein initiating the environmental control modification comprises:
    transitioning the chilled air filter from an inactive state to the active state, wherein the chilled air filter is not adapted to reduce the humidity level while in the inactive state.

11. The method of claim 10, further comprising:
    after initiating the environmental control modification:
        making, by the chassis environmental manager, a second determination that a humidity level and a temperature associated with the computing component are within a nominal threshold; and
        in response to the second determination:
            transitioning, by the chassis environmental manager, the chilled air filter to the inactive state.

12. The method of claim 8, wherein the chilled air filter is disposed in a portion of information handling system through which the airflow traverses.

13. The method of claim 8, wherein the computing component is a trace of a circuit card.

14. The method of claim 13, wherein the humidity level is obtained using a humidity sensor integrated into the computing component, wherein the computing component is operably connected to an integrated circuit.

15. A non-transitory computer readable medium comprising computer readable program code, which when executed by a computer processor enables the computer processor to perform a method for environmentally managing an information handling system comprising a computing device, the method comprising:
  thermally managing, using a portion of an airflow, a computing component of the computing device that is housed in a chassis; and
  reducing a humidity level of the portion of the airflow using a chilled air filter while the chilled air filter is in an active state and the computing component is being thermally managed by the portion of the airflow,
  wherein the portion of the airflow is:
    received by the chassis via an air receiving exchange, and
    exhausted by the chassis via an air expelling exchange,
    reducing, using the chilled air filter, a second humidity level of a second portion of the airflow while the second portion of the airflow thermally manages a second computing component of a second computing device housed in a second chassis while the chilled air filter in the active state.

\* \* \* \* \*